(12) United States Patent
Ten Dolle et al.

(10) Patent No.: US 7,319,371 B2
(45) Date of Patent: Jan. 15, 2008

(54) RESONATOR FILTER STRUCTURE HAVING EQUAL RESONANCE FREQUENCIES

(75) Inventors: Hendrik Klaas Jan Ten Dolle, Nijmegen (NL); Hans Peter Loebl, Monschau-Imgenbroich (DE)

(73) Assignee: NXP B.V., Eindhoven (NL)

( * ) Notice: Subject to any disclaimer, the term of this patent is extended or adjusted under 35 U.S.C. 154(b) by 252 days.

(21) Appl. No.: 10/542,834

(22) PCT Filed: Dec. 22, 2003

(86) PCT No.: PCT/IB03/06368

§ 371 (c)(1),
(2), (4) Date: Jul. 20, 2005

(87) PCT Pub. No.: WO2004/066490

PCT Pub. Date: Aug. 5, 2004

(65) Prior Publication Data

US 2006/0055488 A1 Mar. 16, 2006

(30) Foreign Application Priority Data

Jan. 20, 2003 (EP) .................................. 03100103

(51) Int. Cl.
*H03H 9/54* (2006.01)
*H03H 9/64* (2006.01)
(52) U.S. Cl. ...................... 333/188; 333/189; 333/190; 333/193
(58) Field of Classification Search ................ 333/190, 333/188, 189, 193
See application file for complete search history.

(56) References Cited

U.S. PATENT DOCUMENTS

| | | | | |
|---|---|---|---|---|
| 5,892,418 A * | 4/1999 | Onishi et al. | ................ | 333/193 |
| 6,388,544 B1 * | 5/2002 | Ella | ........................... | 333/189 |
| 6,542,055 B1 * | 4/2003 | Frank et al. | ................. | 333/189 |
| 6,870,446 B2 * | 3/2005 | Ohara et al. | ................. | 333/188 |
| 2001/0012237 A1 * | 8/2001 | Taniguchi | .................... | 367/43 |
| 2003/0179053 A1 * | 9/2003 | Aigner et al. | ............... | 333/189 |

* cited by examiner

*Primary Examiner*—Barbara Summons

(57) ABSTRACT

The invention relates to a resonator filter structure (10) for radio frequency (RF) filters, especially a bulk acoustic wave (BAW) filter structure. According to the invention, a resonator filter structure (10) is constructed with a BAW lattice filter section (20), in which all of the BAW resonator elements (20-1, 20-2, 20-3, 20-4) within the BAW lattice filter section (20) have substantially equal resonance frequencies. According to the invention, there are parallel capacitances (30-1, 30-2) connected in parallel to the BAW resonators (20-2, 20-3) of one branch type of the BAW lattice filter section (20). Thus, anti-resonance frequency of the respective BAW resonator (20-2, 20-3) is tuned. That results in a very narrow passband which corresponds approximately to the difference in anti-resonance frequencies between diagonal and horizontal branches of the lattice filter section (20). The parallel capacitances (30-1, 30-2) are used to tune the bandwidth: the smaller the capacitance, the smaller the bandwidth. Moreover, due to the lattice structure at one port of the resonator filter signal guidance will be balanced while at the other port signal guidance can be unbalanced or balanced according to the application needs.

13 Claims, 3 Drawing Sheets

RESONATOR FILTER STRUCTURE HAVING EQUAL RESONANCE FREQUENCIES

Figure 1:
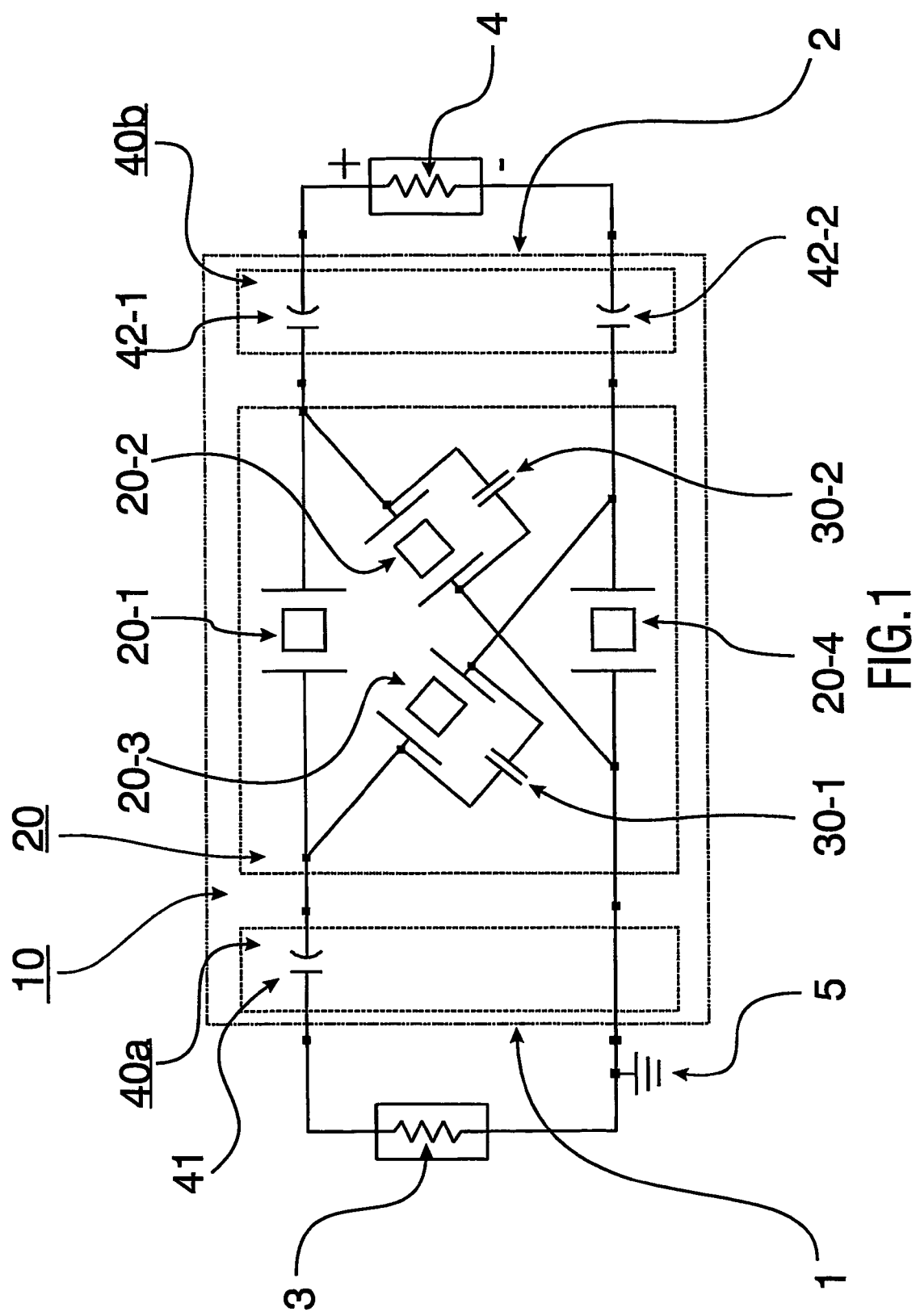

The present invention relates to a resonator filter structure.

More specifically, the invention relates to a resonator filter structure, in particular a radio frequency (RF) filter structure, arranged for providing a passband which can be defined by frequencies as a center frequency $f_C$, a lower cut off frequency $f_L$, a upper cut off frequency $f_U$ comprising between an input port and an output port at least a lattice type filter section having two lattice branch types being a lattice branch and a series branch wherein resonator elements are arranged in said series branches as series arms having a resonance frequency $f_{X1R}$ and an anti-resonance frequency $f_{X1A}$ and wherein resonator elements are arranged in said lattice branches as lattice arms having a resonance frequency $f_{X2R}$ and a anti-resonance frequency $f_{X2A}$.

The development of mobile telecommunications continues towards ever smaller and increasingly complicated handheld units. This leads to increasing requirements on the miniaturization of the components and structures used in the mobile communication means. This concerns radio frequency (RF) filter structures, which despite the increasing miniaturization should be able to withstand considerable power levels, should have very steep passband edges and low losses, and desirably should provide a narrow passband. Due to use of high frequencies in the range of GHz special circuit elements for building RF filter structures are required and high frequency related concerns have to be dealt with.

Accordingly, it is known to use mechanical resonator characteristics in filter circuits for electrical signals. These resonators can be divided into two classes that are derived from the utilized kind of mechanical vibration. In a first case, surface acoustic vibration modes of a solid surface are utilized, in which modes the vibration is confined to the surface of the solid, decaying quickly away from the surface. In other words, a surface acoustic wave is travelling on the surface of the solid material, wherein the mechanical or acoustic waves, respectively, are coupled in and out via applicable formed electrical connections that cause a frequency selective behavior. Due to the used surface acoustic waves such elements are called Surface Acoustic Wave (SAW) filters or SAW resonators. A SAW resonator typically comprises a piezoelectric solid and two interdigitated structures as electrodes. Various circuits as filters or oscillators containing resonator elements are produced with SAW resonators, which have the advantage of very small size, but unfortunately a weakness in withstanding high power levels.

In the second case, a mechanical vibration of a bulk material is used which is sandwiched between at least two electrodes for electrical connection. Typically the bulk material is a single piezoelectric layer (piezo) disposed between the two electrodes. When alternating electrical potential is applied across the metal-piezo-metal sandwich, the entire bulk material expands and contracts, creating the mechanical vibration. This vibration is in the bulk of the material, as opposed to being confined to the surface, as is the case for SAWs. Therefore, such elements are called Bulk Acoustic Wave (BAW) resonators. BAW resonators are often employed in bandpass filters having various topologies. Further known BAW resonator elements are thin film bulk acoustic resonators, so called FBARs, which are created using a thin film semiconductor process to build the metal-piezo-metal sandwich in air in contrast to the afore-mentioned BAWs, which are usually solidly mounted to a substrate.

Figure 2:
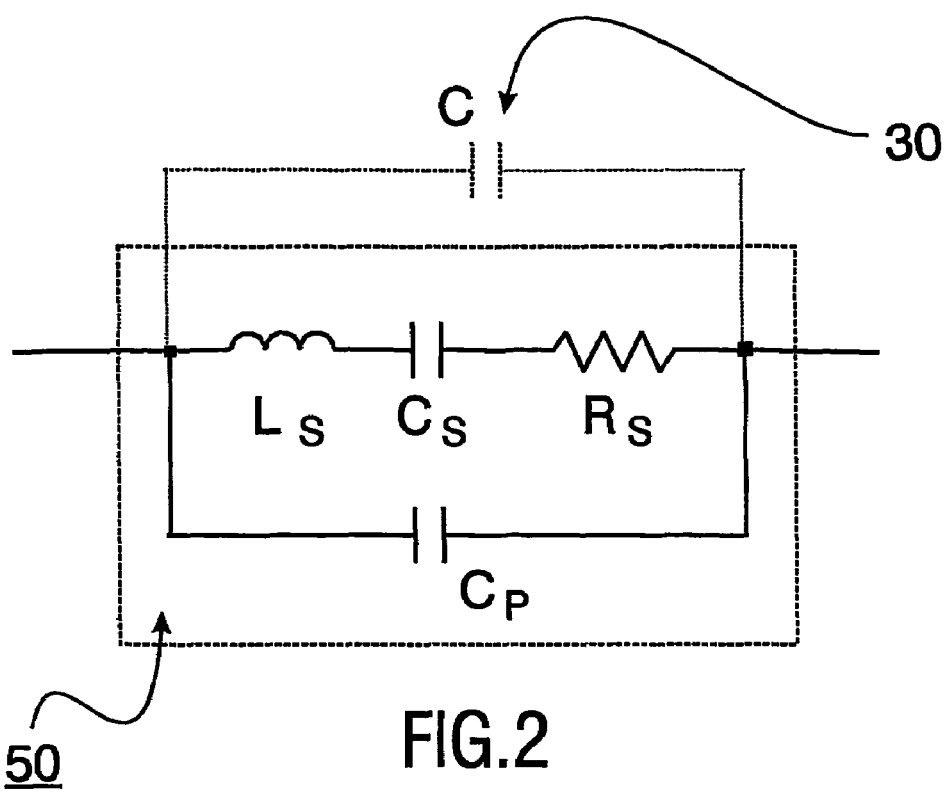

The electrical behavior of a SAW resonator or a BAW resonator is quite accurately characterized by the equivalent circuit, which is shown in the accompanying FIG. 2. In FIG. 2 there is a branch comprising a series combination of an equivalent inductance Ls, an equivalent capacitance Cs, and an equivalent resistance Rs. Ls and Cs are the motional inductance and capacitance respectively and Rs represents the acoustic losses of the resonator. These series elements are connected in parallel to a capacitance Cp that follows from the dielectric properties of the piezoelectric material. Therefore, each SAW or BAW resonator comprises two characteristic resonance frequencies, which is a series resonance frequency and a parallel resonance frequency. The first is mostly called resonance frequency $f_R$ and the second is also known as anti-resonance frequency $f_A$.

Circuits comprising BAW or SAW elements in general are better understood in view of above-introduced element equivalent circuit. The series resonance of the individual resonator element is caused by the equivalent inductance Ls and the equivalent capacitance Cs. At frequencies that are lower than the series resonance frequency, the impedance of the resonator element is capacitive. At frequencies higher than the series resonance frequency of the resonator element, but which are lower than the parallel resonance frequency of the resonator element, caused by the parallel capacitance Cp, the impedance of the resonator element is inductive. Also, at higher frequencies than the parallel resonance frequency impedance of the resonator element is again capacitive.

As to the impedance characteristic of the resonator element with respect to signal frequency, at the (series) resonance frequency $f_R$ of the resonator element, the impedance of the resonator element is low, i.e. in an ideal case, where there are no losses in the element, the resonator element functions like a short circuit. At the parallel or anti-resonance frequency $f_A$, respectively, the impedance of the resonator element is high, i.e. in an ideal case without losses the impedance is infinite and the device resembles an open circuit at the anti-resonance frequency. Therefore, the resonance- and anti-resonance frequencies ($f_R$ and $f_A$) are important design parameters in filter design. The resonance and anti-resonance frequencies are determined by process parameters like the thickness of the piezoelectric layer of each resonator element and/or the amount of massloading.

A first known filter type with BAW resonator elements is constructed in a topology known as ladder type topology. For the purposes of this description, ladder type filters that are built primarily of BAW resonator elements are referred to as "BAW ladder filters". BAW ladder filters are typically made so that one or more BAW resonators are series-connected within the filter and one or more BAW resonators are shunt-connected within the filter. Further, a BAW ladder filter is typically designed so that series-connected resonators also called "series resonators", yield series resonance at a frequency that is approximately equal to, or near, the desired, i.e. design or center, frequency of the respective filter. Further, shunt-connected resonators, also referred to as "shunt resonators" or "parallel resonators", yield parallel resonance at a frequency that is approximately equal to, or near, the desired center frequency of the respective filter.

Figure 4:
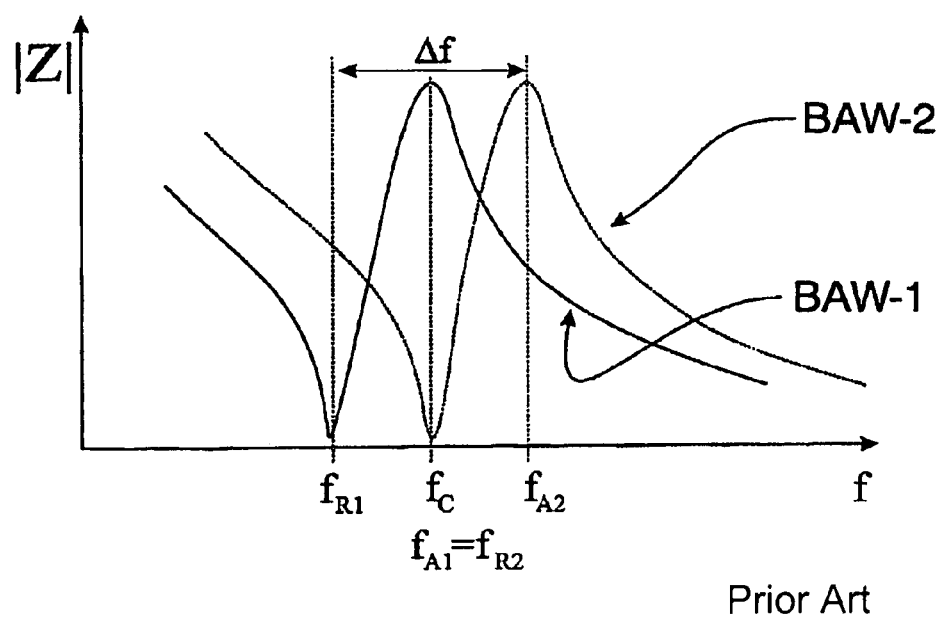

A second known circuit topology for filters is the BAW lattice circuit, which circuit topology is also called balanced bridge design. Such a BAW lattice circuit has a stopband when all branches have approximately equal impedance and a passband when one branch type, i.e. the series arm or the lattice arm, respectively, behaves inductive and the other capacitive. FIG. 4 shows the impedance characteristics of two different BAW resonator elements, BAW-1 and BAW-2, usually used in filter design. BAW-1 and BAW-2 are made such, as anti-resonance frequency $f_{A1}$ of BAW-1 is substantially equal to resonance frequency $f_{R2}$ of BAW-2. Thus, it can be seen that with such two types of BAW resonators according to the afore-mentioned circuit topologies BAW resonator filters can be constructed, which have a passband approximately corresponding to the difference Δf between the lowest resonance frequency, here $f_{R1}$, and the highest anti-resonance frequency, here $f_{A2}$. BAW series and lattice resonator elements may be exchanged provided series or horizontal resonators are of one type and lattice or diagonal resonators are of the other type. The bandwidth, i.e. the passband, of the thus created filter corresponds approximately to the difference between the highest anti-resonance frequency and the lowest resonance frequency of the used resonator elements. BAW lattice circuits have the advantage that there is a deep stopband rejection far away from the passband.

However, for receive band filters corresponding with modern telecommunication standards, e.g. PCS, steep transition from stopband to passband is required since Tx and Rx bands are closely separated. For instance, in Extended GSM (EGSM) the standard for European second generation 1 GHz mobile communication, Rx and Tx bands are centered at 942.5 and 897.5 MHz, respectively. Both bands have a bandwidth of 35 MHz, resulting in fractional bandwidth of 3.71% and 3.9% for the Rx and Tx, respectively. Moreover, some newer applications, for example, GPS or TV up conversion filter require even smaller bandwidths. A way to reduce filter bandwidth of BAW lattice filters is to decrease the coupling coefficient of the BAW resonators. However, two types of resonators are needed, which must provide a slight offset in resonance frequency and anti-resonance frequency. In other words: the narrower needed filter bandwidth, the smaller the needed offset in resonance frequencies between the two types of resonators and thus, the more difficult becomes fabrication process control.

Accordingly, in US laid open patent application U.S. 2001/0012237 a surface acoustic wave (SAW) filter structure includes a piezoelectric substrate and a plurality of SAW resonators mounted on the piezoelectric substrate. The SAW resonators are connected so as to constitute a lattice-type filter circuit having series-arm resonators and lattice-arm resonators, wherein the resonance frequency of the lattice-arm resonators is substantially equal to the anti-resonance frequency of the series-arm resonators or vice versa For improvement of such filter in U.S. 2001/0012237 it is suggested to make a gamma value of the lattice-arm resonators and a gamma-value of the series-arm resonators different from each other by using capacitors in parallel to the SAW resonators and/or by adjusting SAW resonator geometry.

Therefore, it is an object of the present invention to provide a filter structure, in particular a radio frequency (RF) filter structure, having a very narrow passband. It is a further object of the invention to provide a radio frequency (RF) filter structure, of which the fabrication process can easier be controlled.

Accordingly, a resonator filter structure of the present invention is characterized by having resonator elements in a lattice type filter section having substantially equal resonance frequencies, i.e. $fX1R \approx fX2R$ and substantially equal anti-resonance frequencies, i.e. $fX1A \approx fX2A$. In other words: the resonator elements of the lattice type filter section are made substantially equal, namely the resonance frequency and the anti-resonance frequency of the lattice arm resonator elements and the series arm resonator elements are substantially equal. Further, there are means for moving at least one of said anti-resonance frequencies $f_{X1A}$ and $f_{X2A}$, respectively, or one of said resonance frequencies $f_{X1R}$ and $f_{X2R}$, respectively, of the resonator elements in one of said lattice branch types.

In a first embodiment of the invention, by connecting discrete capacitances C according to the present invention in parallel across each of both lattice arm resonator elements or across each of both series arm resonator elements the anti-resonance frequency of those resonator elements is moved, i.e. decreased, by the influence of the respective parallel capacitance. This advantageously results in a very narrow passband of the whole resonator lattice circuit. It should be noted that series and lattice branches within such a resonator lattice filter section according the invention can be exchanged. In other words: it has the same advantageous effect when the anti-resonance frequency of the lattice branches is decreased compared to the anti-resonance frequency in the series branches as when it is done vice versa.

In a second embodiment of the invention, by connecting discrete capacitances C according to the present invention in series to each of both lattice arm resonator elements or in series to each of both series arm resonator elements the resonance frequency of those resonator elements is moved, i.e. increased, by the influence of the respective series capacitance. This advantageously results in a very narrow passband of the whole resonator lattice circuit. It should be noted that series and lattice branches within such a resonator lattice filter section according the invention can be exchanged. In other words: it has the same advantageous effect when the resonance frequency of the lattice branches is increased compared to the resonance frequency in the series branches as when it is done vice versa.

Due to the implementation of a lattice filter section, unbalanced-in to balanced-out signal guidance can be provided. Thus, one of the input port and output port can be used as a balanced signal port while the other of the input port and output port is an unbalanced signal port. This is advantageous, when balanced output is preferred, for instance, in case the filter has to be connected to the balanced input of a low noise amplifier (LNA). Hence, input port or output port of the filter structure or even none of both may be connected to a fixed reference potential, e.g. ground potential of the circuit.

By the lattice filter structure of the present invention a very narrow filter bandwidth can be realized by using one type of resonator in the lattice circuit having one resonance frequency. As resonator elements are used acoustic wave resonator elements, preferably surface acoustic wave (SAW) resonators and more preferably bulk acoustic wave (BAW) resonators. Therefore, the processing is significantly simplified by eliminating the step of creating an offset in resonance frequencies of the resonator elements. For example, when BAW resonator elements are used in the invention, such a BAW resonator comprises a stack on a substrate with at least one or more acoustic reflective layer, a bottom electrode, a bulk, a top electrode, and an optional massload on top of the top electrode. Thereby, the bulk of the BAW resonator elements comprise a piezoelectric layer having a predetermined thickness and being made of an piezoelectric material such as aluminum nitride (AlN) or zinc oxide (ZnO) and having an optional additional dielectric layer, for instance, silicon oxide (SiO2). The combination of silicon oxide (SiO2) and aluminum nitride (AlN) in the BAW resonators reduces the coupling coefficient of the BAW resonator elements, as required in some applications with respect, for instance, to bandwidth or temperature stability. According to the fabrication process of such BAW resonator elements, advantageously, the thickness of the component layers of the bulk, and/or the massload, and/or the electrode layers for each BAW resonator element can be used to arrange the BAW resonator elements to have a predetermined resonance frequency and a predetermined anti-resonance frequency. Further, advantageously all BAW resonators can be made with same thickness of the piezoelectric layer and furthermore, no massloading is required.

For so-called thickness modes the frequency of acoustic vibration is approximately inversely proportional to the thickness of the piezoelectric layer. The piezoelectric thickness is therefore of the order of 1 micron, so typically a thin-film semiconductor process is used. In one embodiment, the solidly-mounted bulk acoustic wave resonator (sometimes called SBAR) one or more acoustic layers are employed between the piezoelectric layer and the substrate. An alternative embodiment of thin-film BAW resonator elements (sometimes called FBAR) employs a membrane approach with the metal-piezo-metal sandwich suspended in air. BAW resonators are often employed in bandpass filters having various topologies. One advantage of BAW resonators is the intrinsically better power handling compared to the interdigitated structures used in surface acoustic wave (SAW) resonators, especially at frequencies of modern wireless systems where the pitch of the interdigital structures must be sub-micron.

With the parallel capacitances C, which are connected in parallel to the resonator elements of one branch type of the lattice type filter section, i.e. the series or the lattice arm resonator elements, the anti-resonance frequencies of those resonators are decreased. Thus, the capacitance value C is used for tuning the filter bandwidth, wherein the smaller the capacitance C, the smaller the resulting bandwidth of the filter. The inventors have found that to create a good stopband rejection, the total capacitances of each branch need to be equal in the stopband. Therefore, good stopband rejection, i.e. attenuation, has been achieved when the value of the parallel capacitances C correspond substantially with $$C = (1-x) \cdot A \cdot C_{AREA}.$$

In this equation A is an area of a BAW resonators on the substrate, where the BAW resonator element is mounted to, of one of the branch types of the lattice type filter. Further the area on the substrate has a capacitance per area $C_{AREA}$. The factor x is a fraction of the area A, wherein x·A is the area of a BAW resonators of the respective other branch type of the lattice type filter. Such capacitance C has to be connected as parallel capacitance in parallel to each BAW resonator having area x·A on the substrate of the device.

As to practical implementation of the BAW lattice filter design of the invention, a BAW resonator basically consists of two electrodes with a piezoelectric material enclosed between these two electrodes. In turn this whole system is enclosed between to acoustically reflecting media in order to keep the acoustic energy in the piezoelectric layer. AU layers will impact the resonator properties, e.g. resonance frequency, bandwidth, Q-factor etc. In order to turn lattice circuits and cascaded lattice and ladder circuits into commercially attractive products, it is almost a prerequisite to have two electrodes. These two electrodes, inherent to BAW resonators, provide a solution for the needed crossing of interconnected lines. In contrary to BAW elements, electrodes of SAW resonator elements are typically defined in one metal layer therefore making lattice interconnect wiring much more complicated.

As to the means for impedance matching, according to the invention there are inductive elements L and/or capacitive elements C, which are connected in series and/or parallel to the one or both of the input port and output port. In one embodiment the means for impedance matching comprise a series capacitive element connected in series to one of the ports and series capacitive element connected in series to the other of the ports. It should be noted that the inventors have discovered that in certain cases there are no discrete impedance matching means necessary, or impedance matching has to be done only at one port of the input port or output port.

The above and other objectives, features and advantages of the present invention will become more clear from the following description of the preferred embodiments thereof, taken in conjunction with the accompanying drawings. It is noted that through the drawings same or equivalent parts remain the same reference number. All drawings are intended to illustrate some aspects and embodiments of the present invention. Circuits are depicted in a simplified way for reason of clarity. It goes without saying that not all alternatives and options are shown and therefore, the present invention is not limited to the content of the accompanying drawings.

Figure 3:
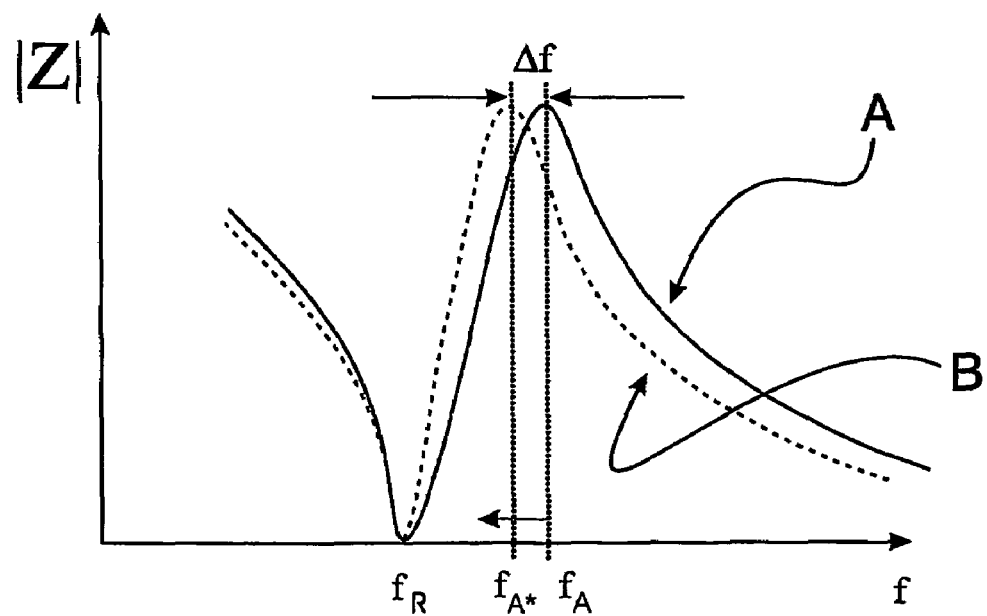

In the following, the present invention will be described in greater detail by way of example with reference to the accompanying drawings, in which FIG. 1 shows a circuit diagram of a resonator filter structure with BAW lattice filter section arranged with parallel capacitances connected in parallel to lattice arm BAW resonators and impedance matching capacitances connected in series to the ports of the Filter;

FIG. 2 illustrates an equivalent element circuit of a BAW resonator element together with a parallel capacitance connected in parallel to the BAW resonator;

FIG. 3 shows impedance characteristics of two substantial equal BAW resonator elements A and B, wherein the effect of a parallel capacitance as shown in FIG. 2 on the anti-resonance frequency of a BAW resonator B is depicted by a doted line; and FIG. 4 shows the impedance characteristics of two BAW resonator elements drawn over signal frequency, wherein resonance frequencies, anti-resonance frequencies and center frequency are arranged as usual.

FIG. 1 shows a resonator filter structure 10 according to the first embodiment of the present invention that comprises a first port 1 and a second port 2. There is connected a first load 3 to the first port 1 and a second load 4 towards the second port 2. The first port 1 has a connection to a fixed reference potential which is in this example ground 5 of the circuit. Thus the input port 1 is a port with unbalanced signal guidance. The first load may represent an internal resistance of a generator that is driving a radio frequency signal as input for the resonator filter structure 10; in an application such generator, for instance, may be a receiving antenna of a communication unit. Further, the second load 4 may represent the input resistance of a following stage like, for instance, a low noise amplifier (LNA). As to signal guidance the first port 1 is grounded to ground 5, which causes the first port 1 to be an unbalanced port.

It is clear for the man skilled in the art that for the reason of optimal power transition there is need for impedance matching at the input port 1 and the output port 2. At least, the input impedances of the resonator filter structure 10 have to be matched according to the respective loads 3 and 4 within the frequency band that corresponds to the passband of the resonator filter structure 10. The passband is defined by a lower cut-off frequency, a center frequency, and an upper cut-off frequency, wherein a cut-off frequency could be derived by a certain signal power level to which the signal has decreased from passband towards the stopband.

The central part of the shown resonator filter structure 10 in FIG. 1 is a lattice filter section 20, which comprises four substantial equal BAW resonator elements 20-1, 20-2, 20-3, 20-4. The circuit structure, i.e. topology, of this BAW lattice filter section 20 is constructed with the four BAW elements 20-1, 20-2, 20-3, 20-4 in the known principle of a balanced bridge circuit. Thus, respective two of the four resonator elements, i.e. 20-1 and 20-2 are connected in series building a first series path, and 20-3 and 20-4 are connected in series building a second series path. The connection nodes between two BAW elements of the first and second series path represent respective one output node of the BAW lattice circuit. Further, first and second series path of the bridge are connected in parallel to the input nodes of the BAW lattice circuit. Due to the illustration of the BAW lattice filter section 20, resonator elements 20-1 and 20-4 are also called horizontal elements or series elements of the BAW lattice circuit, and BAW elements 20-2 and 20-3 are also called diagonal elements or lattice elements of the BAW lattice filter section 20. Moreover, according to this naming convention each branch of the BAW lattice filter section 20 is called an arm of the lattice circuit, wherein a horizontal element builds an horizontal or series arm, respectively, and a diagonal element builds a diagonal or lattice arm of the lattice circuit, respectively.

In FIG. 1, all BAW resonators 20-1, 20-2, 20-3, 20-4 of the BAW lattice filter section 20 are substantial equal that means the individual BAW elements have same resonance frequency and same anti-resonance frequency. However, between the horizontal BAW resonator elements 20-1, 20-4 and the diagonal BAW resonator elements 20-2, 20-3 there is a difference in area on the substrate on which the filter circuit is manufactured. The parallel capacitances 30-1, 30-2 which are connected in parallel towards the diagonal BAW elements 20-2, 20-3 move the anti-resonance frequencies of respective diagonal BAW resonators 20-2 and 20-3. In other words, as tuning elements the capacitances 30-1 and 30-2 adjust the filter passband and thus, ease advantageously fabrication process of the BAW lattice filter section 20 according to the present invention.

Oppose horizontal BAW resonators 20-1 and 20-4 have an area A and diagonal BAW resonators 20-2 and 20-3 have a fraction x of this area A on the substrate, wherein x is a value between zero and 1. The electrodes of the BAW resonators cause a capacitance per area $C_{AREA}$. As to an optimal value for the parallel capacitances 30, it has found by the inventors that for a good stopband rejection the total capacitance of each lattice arm in the BAW lattice type filter section 20 needs to be equal. Thus, taking the values for the parallel capacitances 30-1, 30-2 according to the formula $$C=(1-x) \cdot A \cdot C_{AREA}$$

provides for good stopband rejection. It goes without saying that for achieving the same effect on the bandwidth horizontal, i.e. series, arm BAWs may be swapped with diagonal, i.e. lattice, arm BAWs. The BAW lattice filter section 20 has its desired center or design frequency which lays approximately in the middle between the anti-resonance frequency of the series arm BAW resonator elements 20-1 and 20-4 and the lattice arm BAW resonator elements 20-2 and 20-3.

As to the impedance matching for improved power transition, at the input port 1 of the filter structure 10, there are impedance matching sections 40a and 40b. Impedance matching section 40a comprises a series capacitance 41 which is arranged for impedance matching between the input impedance of the BAW lattice filter section 20 and the output impedance of the load 3. At the output port 2 of the BAW lattice filter section 20, there is a impedance matching section 40b with two series capacitances 42-1 and 42-2 connected symmetrically, for the reason of balanced signal guidance, in series to the output port 2, which is arranged for impedance matching between the output impedance of the BAW lattice filter 10 and the input impedance of the load 4.

Since all BAW lattice elements 20-1, 20-2, 20-3, 20-4 have equal resonance frequency and anti-resonance frequency, which is very unusual in lattice filter technology, the fabrication process is advantageously simplified by eliminating the step of creating an offset in resonance frequencies. This means all resonators can be made with the same thickness in the piezoelectric layer, furthermore no mass-loading is required.

FIG. 2 shows the equivalent element circuit for a BAW resonator element 50, which comprises a series inductance $L_S$, a series capacitance $C_S$ and a series resistance $R_S$. The resonance frequency $f_R$ corresponds to $L_S$ and $C_S$. Further, there is a parallel capacitance $C_P$ that is mainly caused by the electrodes of the BAW resonator. The anti-resonance frequency of the BAW resonator element 50 corresponds to $L_S$ and both capacitances $C_S$ and $C_P$. Moreover, there is a parallel capacitance 30, which is drawn in doted lines, being connected in parallel to the equivalent elements of the BAW resonator 50. With the parallel capacitance 30 it is possible to tune the anti-resonance frequency by increasing the effective parallel capacitance, which is composed substantially of $C_P$ and C.

FIG. 3 is a diagram of the impedance characteristic of the BAW resonator elements of the BAW lattice filter structure according to the present invention. More clearly, there is a first impedance characteristic drawn in solid line of a BAW resonator A which corresponds to those BAW resonators without a parallel capacitance C which are in FIG. 1 the BAW resonators 20-1 and 20-4. The second impedance characteristic drawn in broken line of a BAW resonator B corresponds to those BAW resonators With parallel capacitance C which are in FIG. 1 the BAW resonators 20-2 and 20-3. From FIG. 3 can easily be seen that both types of BAW resonators have equal resonance frequency $f_R$. However, there is a slight difference between the anti-resonance frequencies $f_A$ of BAW resonator A and resulting anti-resonance frequency $f_A^*$ of BAW resonator B which is designed by use of the parallel capacitances C which is represented in FIG. 1 by the capacitances 30-1 and 30-2 and in FIG. 2 by the capacitance 30.

With respect to FIG. 3 it can be understood how the BAW lattice filter section 10 can provide such very narrow passband. The BAW lattice filter section 10 of the invention has a stopband when all branches have an equal impedance and a passband when one branch type, i.e. the series arm or the lattice arm, respectively, behaves inductive and the other capacitive. Due to the fact that there are used BAW resonators resonating at approximately at the same frequencies, i.e. resonance frequency $f_R$ and anti-resonance frequency $f_A$, in all branches of the BAW ice filter section 20, while the anti-resonance frequency of both BAW resonators in one branch type of the BAW lattice filter section 20, i.e. the series arm or the lattice arm, respectively, is moved just a bit, there is only a small frequency range $\Delta f$ were one branch type is inductive and the other capacitive. This way, the very narrow bandpass filter is created, wherein the passband is much narrower than the difference between resonance frequency $f_R$ and anti-resonance frequency $f_A$ of one single BAW resonator. The caused passband can be determined approximately by the difference in anti-resonance frequencies $f_A$ and $f_A$* between the lattice and the series branch BAW resonators which is depicted as $\Delta f$ in FIG. 3. It goes without saying that the BAW series and lattice resonator elements may be exchanged.

With the present invention a resonator filter structure for a radio frequency (RF) filter has been introduced, especially a bulk acoustic wave (BAW) filter structure. According to the invention, a resonator filter is constructed with a BAW lattice filter configuration, in which all of the BAW resonator elements within the BAW lattice filter section have substantially equal resonance frequencies. According to the invention, there are parallel capacitances connected in parallel to the BAW resonators of one branch type of the BAW lattice filter section. Thus, anti-resonance frequency of the respective BAW resonator is tuned. That results in a very narrow passband which corresponds approximately to the difference in anti-resonance frequencies between diagonal and horizontal branches of the lattice filter section. The parallel capacitances are used to tune the bandwidth: the smaller the capacitance, the smaller the bandwidth. Moreover, due to the lattice structure at one port of the resonator filter signal guidance will be balanced while at the other port signal guidance can be unbalanced or balanced, as needed in the respective application.

It should be noted that the present invention is not restricted to the embodiments of the present invention, in particular the invention is not restricted to receive filters which have been used in this specification for reason of example. Moreover, the principle of the present invention can be applied to any application that needs in a high frequency environment a filter that provides very narrow bandwidth and high stopband.

The invention claimed is:

1. A resonator filter structure on a substrate to provide a passband defined by a center frequency $f_C$, a lower cut off frequency $f_L$, and an upper cut off frequency $f_U$, the resonator filter structure comprising:
    an input port;
    an output port; and
    a lattice type filter section between the input port and the output port, the lattice type filter section comprising:
       first resonator elements arranged in series branches as series arms having a resonance frequency $f_{X1R}$ and an anti-resonance frequency $f_{X1A}$;
       second resonator elements arranged in lattice branches as lattice arms having a resonance frequency $f_{X2R}$ and a anti-resonance frequency $f_{X2A}$, wherein all of said resonator elements within said lattice type filter section have substantially equal resonance frequencies and substantially equal anti-resonance frequencies; and
       means for tuning at least one of said anti-resonance frequencies or one of said resonance frequencies of the resonator elements, wherein the means for tuning at least one of said anti-resonance frequencies comprises a capacitance C connected to each of said resonator elements.

2. The resonator filter structure according to claim 1, wherein said capacitance C connected to each of said resonator elements comprises a parallel capacitance C connected in parallel to each of said resonator elements.

3. The resonator filter structure according to claim 2, wherein all branches of said lattice type filter section substantially equal total capacitance at least outside said passband.

4. The resonator filter structure according to claim 3, wherein said parallel capacitance C corresponds with $$C=(1-x)\cdot A\cdot C_{AREA},$$

wherein A is an area on said substrate of a bulk acoustic wave (BAW) resonator element in one branch types of said lattice filter section wherein said area has a capacitance per area $C_{AREA}$ and x is a fraction of said area A, wherein x·A is an area of another BAW resonator element of another branch type of said lattice filter section.

5. The resonator filter structure according to claim 1, wherein said capacitance C connected to each of said resonator elements comprises a series capacitance C connected in series to each of said resonator elements.

6. The resonator filter structure according to claim 1, wherein said resonator elements comprise acoustic wave resonator elements in the form of bulk acoustic wave (BAW) resonator elements or surface acoustic wave (SAW) resonator elements.

7. The resonator filter structure according to claim 6, wherein said BAW resonator elements comprise at least a piezoelectric layer having an equal thickness in all of said BAW resonator elements.

8. The resonator filter structure according to claim 7, wherein said piezoelectric layer comprises a layer of piezoelectric material of aluminum nitride (AlN) and/or zinc oxide (ZnO) and at least an optional additional dielectric layer of silicon oxide ($SiO_2$).

9. The resonator filter structure according to claim 1, further comprising means for impedance matching connected at least to one port of said input port and said output port.

10. The resonator filter structure according to claim 9, wherein said means for impedance matching comprise discrete inductive elements and/or discrete capacitive elements connected in series and/or in parallel to said at least one port.

11. The resonator filter structure according to claim 1, wherein a first port signal guidance of at least one port of said input port and said output port is balanced.

12. The resonator filter structure according to claim 11, wherein a second port signal guidance of at least one port of said input port and said output port is unbalanced.

13. The resonator filter structure according to claim 1, wherein the resonator filter structure comprises a radio frequency (RE) resonator structure.

* * * * *